United States Patent [19]

Holm et al.

[11] Patent Number: 5,077,589
[45] Date of Patent: Dec. 31, 1991

[54] MESFET STRUCTURE HAVING A SHIELDING REGION

[75] Inventors: Paige M. Holm, Phoenix, Ariz.; Daniel L. Rode, St. Louis, Mo.

[73] Assignee: Motorola, Inc., Schaumburg, Ill.

[21] Appl. No.: 666,436

[22] Filed: Mar. 11, 1991

Related U.S. Application Data

[63] Continuation-in-part of Ser. No. 498,123, Mar. 23, 1990, abandoned.

[51] Int. Cl.⁵ .................. H01L 29/48; H01L 29/80; H01L 29/68; H01L 29/40
[52] U.S. Cl. .................. 357/23.4; 357/15; 357/238; 357/23.14; 357/53
[58] Field of Search .................. 357/22, 16, 23.4, 238, 357/23.14, 52, 53, 15

[56] References Cited

U.S. PATENT DOCUMENTS

| | | | |
|---|---|---|---|
| 4,455,565 | 6/1984 | Goodman et al. | 357/23.8 |
| 4,805,003 | 2/1989 | Holm et al. | 357/23.4 |
| 4,896,196 | 1/1990 | Blanchard et al. | 357/23.14 |
| 4,920,388 | 4/1990 | Blanchard et al. | 357/23.14 |

OTHER PUBLICATIONS

Sze, S. M., Semiconductor Devices-Physics and Technology, p. 200, Apr. 30, 1985.

Primary Examiner—Andrew J. James
Assistant Examiner—Cynthia S. Deal
Attorney, Agent, or Firm—Harry A. Wolin

[57] ABSTRACT

A semiconductor device structure comprises a semiconductor substrate having a semiconductor layer of the same conductivity type formed on its first surface. A drain contact is formed on the second surface of the substrate and conductive regions having the opposite conductivity type of the substrate are formed in the semiconductor layer and are separated by a predetermined distance. Channel regions having the same conductivity type as the substrate are disposed above the conductive regions and source regions are disposed therein. A shielding region is then formed on the surface of the device structure in the area between the conductive regions. The structure allows for reduced or eliminated gate-drain capacitance, reduced output conductance and increased breakdown voltage capability.

12 Claims, 1 Drawing Sheet

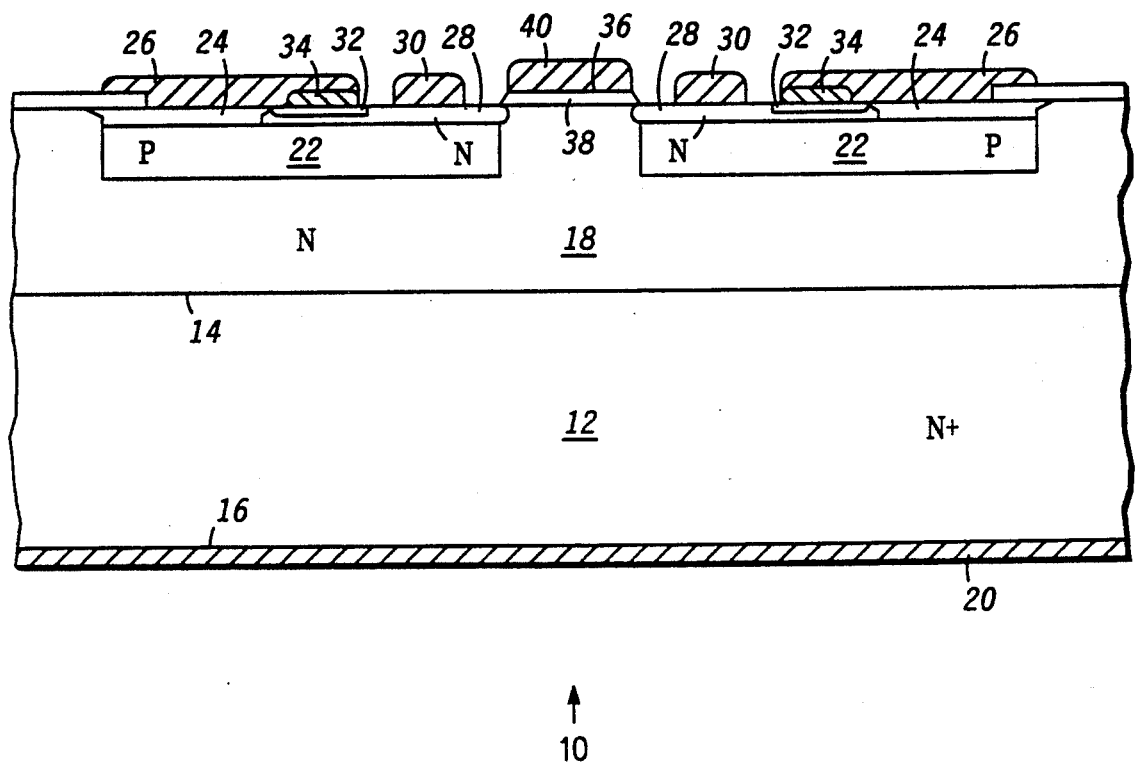

MESFET STRUCTURE HAVING A SHIELDING REGION

This application is a continuation-in-part of prior application Ser. No. 07/498,123 filed Mar. 23, 1990 now abandoned.

BACKGROUND OF THE INVENTION

This invention relates, in general, to semiconductor devices, and more particularly to a metal semiconductor field effect transistor (MESFET) structure.

FETs may typically be used in high voltage applications such as amplifiers and switching power supplies However, there are fundamental problems inherent in the design and performance of standard power FETs.

The incompatibility of geometry parameters in various regions of the device is detrimental. For high current and high gain, channel regions must be short and heavily doped with thickness limited only by practical values of gate pinchoff voltage. On the other hand, the drain region must be relatively large and lightly doped to drop large amounts of potential across wide depletion widths. These requirements force a compromise in the design and performance of lateral FETs fabricated from single doped layers on semi-insulating substrates. The design and performance compromise as well as the lateral gate and drain arrangement that results in electric field crowding at the electrode edges generally limit breakdown voltage to less than 50 volts. Accordingly, vertical device structures are much more conducive to very high voltage applications since the voltage absorbing layer between the gate and drain can be doped much lower than the channel layer, and the overlapping parallel arrangement of electrodes eliminates crowding effects.

Basic material parameters are also in conflict High carrier mobility is desired in the source and channel This directly influences saturation current levels and gain In the III-V material system, the high mobility compounds tend to have smaller band gaps. In contrast, wide band gap material is desired in the drain regions since avalanche breakdown voltage increases with band gap.

Another problem with power FET design is that for short channel devices, current saturates due to carrier velocity saturation rather than channel pinchoff as in long channel devices. In the saturation region, the potential and electrical field distribution are not fixed and the additional drain voltage is dropped along the channel forming domains of electronic accumulation and depletion. The results of these modifications to the potential and electric field distributions include elevated values of output conductance, gate-drain capacitance and decreased avalanche breakdown voltage. These are commonly referred to as short channel effects and are essentially due to unwanted coupling between the device region which determines current and gain attributes (channel) and the region which determines voltage attributes (gate-drain diode).

One approach to combatting short channel effects has been the addition of a Schottky contact between the gate and drain to essentially form a dual-gate device. The Schottky contact lies adjacent to the original gate and is unmodulated and typically tied to source potential. At drain voltages beyond current saturation, additional drain potential is dropped mostly between the Schottky contact and drain instead of reaching into the channel region under the gate. The Schottky contact shields the channel at high drain voltage and prevents short channel effects.

The use of a "second gate" for shielding has been moderately successful at increasing breakdown voltages of lateral gallium arsenide microwave FETs. An example of this type of vertical device structure is set forth in U.S. Pat. No. 4,805,003 issued on Feb. 14, 1989 to Holm et al. In this structure, the "second gate" comprises two sections of a buried layer that can act as a parasitic back gate on the surface channel. More importantly, depletion of the vertical channel between the layers beneath the first gate acts to shield the channel and surface gate at high drain voltage. The device thus acts as a dual-gate FET, but provides the additional ability to more independently optimize the parameters of each channel due to the vertical structure.

Although increased breakdown voltage has demonstrated the shielding effect, there are only a narrow range of dimensions which provide extension of breakdown voltage without lowering saturation current levels due to saturation between the buried layer sections of the "second gate". Furthermore, even though this region becomes totally depleted, its potential is not locked after saturation but increases due to depletion in the buried layer sections of the "second gate". This allows large potential drops and electric fields beneath the gate. The result is that avalanche breakdown initiated directly under the gate limits the drain voltage.

Accordingly, it would be highly desirable to have a power FET that results in lower output conductance, reduced gate-drain capacitance and increased values of breakdown voltage.

SUMMARY OF THE INVENTION

Accordingly, it is an object of the present invention to provide a semiconductor device structure having isolation that reduces or eliminates gate-drain capacitance.

Another object of this invention is to provide a semiconductor device structure that results in drastically reduced output conductance.

An additional object of the present invention is to provide a semiconductor device structure having increased breakdown voltage capability.

The foregoing and other objects and advantages are achieved in the present invention by one embodiment in which, as a part thereof includes a gallium arsenide substrate having first and second surfaces and being of a first conductivity type. A gallium arsenide layer of the same conductivity type is formed on the first surface of the substrate and a drain contact is formed on the second surface of the substrate. Conductive regions of a second conductivity type are disposed in the gallium arsenide layer and are separated by a predetermined distance. Gallium arsenide channel regions of the first conductivity type are disposed above the conductive regions and source regions also of the first conductivity type are disposed in the channel regions. A shielding region contacting the gallium arsenide layer is formed between the conductive regions.

A more complete understanding of the present invention can be obtained by considering the following detailed description in conjunction with accompanying drawings.

BRIEF DESCRIPTION OF THE DRAWING

The single FIGURE illustrates a highly enlarged cross-sectional view of a MESFET structure embodying the present invention.

DETAILED DESCRIPTION OF THE INVENTION

The single FIGURE illustrates a highly enlarged cross-sectional view of a MESFET structure 10 embodying the present invention. FET 10 includes a substrate 12 having a first surface 14 and a second surface 16. In this embodiment, substrate 12 comprises gallium arsenide although one of skill in the art will understand that other semiconductors or compound semiconductors may be employed. Substrate 12 has an N+ conductivity type and a preferred doping concentration on the order of $10^{18}$ atoms cm$^{-3}$. A drift layer 18 is formed on first surface 14 of substrate 12 and is also comprised of gallium arsenide in this embodiment although one of skill in the art will understand that other semiconductors and compound semiconductors corresponding to the material employed for substrate 12 may be used. Drift layer 18 has an N conductivity type and a typical doping concentration on the order of less than $10^{16}$ atoms cm$^{-3}$. It should be understood that the doping concentration of drift layer 18 may be varied to obtain desired breakdown voltages. Higher breakdown voltages generally will be achieved by employing lower dopant concentrations and vice versa although optimum doping profiles may be tailored to obtain desired performance.

A drain contact 20 is formed by methods well known in the art on second surface 16 of substrate 12. In this embodiment, contact 20 comprises a well known N type metal scheme such as nickel germanium gold disposed on second surface 16 of substrate 12.

Buried conductive regions 22 are formed in drift layer 18 by methods well known in the art. Buried conductive regions 22 are of a P conductivity type and a typical doping concentration is on the order of $10^{17}$ atoms cm$^{-3}$ in this embodiment. They are separated by a predetermined distance such that when FET 10 is turned on, the depletion regions of buried conductive regions 22 will not merge prior to device saturation. Buried conductive regions 22 are contacted in this embodiment by diffusing a P type dopant such as zinc from the surface of drift layer 18 to buried conductive regions 22 to form diffused contact regions 24. As shown herein, diffused contact regions 24 will have a dopant concentration on the order of $10^{20}$ atom cm$^{-3}$. Diffused contact regions 24 are then contacted by Schottky metal 26 formed on the surface of FET 10. Schottky metal 26 comprises a well known P type metal scheme such as titanium platinum gold. It should be understood that Schottky metal 26 will serve as a contact to buried conductive regions 22.

Channel regions 28 are formed above buried conductive regions 22. In this embodiment, channel regions 28 comprise an N conductivity type and have a preferred dopant concentration on the order of $10^{17}$ atoms cm$^{-3}$. Channel regions 28 are contacted by gate contacts 30 comprised of a well known Schottky metal scheme such as titanium platinum gold. It should be understood that gate contacts 30 serve as the gate terminal. Source regions 32 are formed in channel regions 28 and are of an N conductivity type and have a dopant concentration greater than $10^{18}$ atoms cm$^{-3}$ herein. Source regions 32 are contacted by an ohmic metal 34 such as titanium platinum gold as is well known in the art. It should be understood that ohmic metal 34 serves as the source terminal.

A shielding region 36 is formed on the surface of FET 10 between buried conductive regions 22 and also between channel regions 28. Shielding region 36 may or may not laterally extend beyond the edges of buried conductive regions 22 and channel regions 28. Shielding region 36 includes a relatively wide band gap material layer 38 comprising gallium arsenide in this embodiment and a metal shield contact 40 comprising titanium platinum gold herein disposed on layer 38. Wide band gap material layer 38 disposed beneath shield contact 40 allows for increased avalanche breakdown voltage compared to having shield contact 40 disposed directly on the surface of FET 10. Wide band gap material layer 38 should be relatively lightly doped compared to channel regions 28. In this embodiment, wide band gap material layer 38 is N type and has a dopant concentration on the order of $10^{16}$ cm$^{-3}$. Although wide band gap material layer 38 is highly beneficial, it should be understood that it is not essential to the device and that FET 10 would function adequately if metal gate contact 40 were disposed directly on the surface of drift layer 18. It should further be understood that shielding region 36 may also comprise a P-N junction rather than a metal contact.

In operation, the electron flow of FET 10 initiates at source regions 32 and flows through channel regions 28 into the area beneath shielding region 36 and between buried conductive regions 22 and proceeds to drain contact 20. Shielding region 36 and drain contact 20 form a reverse bias Schottky diode wherein shielding region 36 essentially acts as a field plate to smooth out electric field profiles and reduce crowding between buried conductive regions 22.

Prior to saturation, the depletion regions of shielding region 36 and the depletion regions of buried conductive regions 22 must not merge. However, after electron velocity saturation is reached in channel regions 28, the depletion region of the diode formed by shielding region 36 an drain contact 20 merges with the depletion regions of buried conductive regions 22 to isolate channel regions 28 and gate contacts 30. The isolation (shielding) of channel regions 28 allows for reduced or eliminated gate-drain capacitance. Further, output conductance is drastically reduced because the electric field potential profiles at the point of electron velocity saturation in channel regions 28 is frozen at the merger of the depletion regions. Finally, increased breakdown voltage capability is obtained because the diode formed between shielding region 36 and drain contact 20 absorbs the drain bias beyond the saturation voltage. It should be understood that the diode formed between shielding region 36 and drain contact 20 may be designed to various specifications by altering dopant concentration profiles and/or wide band gap material layer 38.

The structure of FET 10 creates a device having 5 terminals. Ohmic metal 34 serves as a terminal for source regions 32, drain contact 20, gate contacts 30 serve as a terminal to channel regions 28, Schottky metal contacts 26 serving as terminals to buried conductive regions 22 and shield metal contact 40 serving as a terminal to shielding region 36. FET 10 can be fine tuned to desired specifications by applying a potential to shield metal contact 40 that is not equal to the potential applied to ohmic metal 34. Further, the potential applied to shield metal contact 40 may be varied within switching or analog cycles for certain applications. Although current may be modulated through shield metal contact 40, gate contacts 30 and Schottky metal 26, the preferred mode of operation for FET 10 includes Schottky metal 26 remaining at a fixed bias (preferably the source potential) and also applying a fixed bias to shield metal contact 40.

Thus it is apparent that there has been provided, in accordance with the invention, an improved semiconductor device structure which meets the objects and advantages set forth above. While specific embodiments of the invention have been shown and described, further modifications and improvements will occur to those of skill in the art. It is desired that it be understood, therefore, that this invention is not limited to the particular forms shown and it is intended in the appended claims to cover all modifications which do not depart from the spirit and scope of this invention.

What is claimed is:

1. A MESFET structure comprising:
   a semiconductor substrate having a first surface and a second surface and being a first conductivity type;
   a semiconductor layer of the first conductivity type disposed on said first surface of said substrate;
   a drain contact disposed on said second surface of said substrate;
   conductive regions of a second conductivity type disposed in said semiconductor layer and being separated from each other by a distance;
   channel regions of the first conductivity type disposed above said conductive regions;
   source regions of the first conductivity type disposed in said channel regions;
   Schottky gate contacts contacting said channel regions; and
   a shielding region, separate from said gate contacts, contacting said semiconductor layer between said conductive regions.

2. The structure of claim 1 wherein the shielding region is disposed in the semiconductor layer and is of the second conductivity type.

3. The structure of claim 1 wherein the shielding region comprises a contact disposed on the surface of the semiconductor layer.

4. The structure of claim 3 wherein the shielding region further comprises a relatively wide band gap material disposed between the surface of the semiconductor layer and the contact.

5. The structure of claim 4 wherein the substrate, the semiconductor layer, the channel regions and the material disposed between the surface of said semiconductor material and the contact all comprise compound semiconductor materials.

6. The structure of claim 5 wherein the compound semiconductor material comprises gallium arsenide.

7. The structure of claim 6 wherein the doping concentrations are on the order of $10^{18}$ atoms $cm^{-3}$ for the substrate, $10^{16}$ atoms $cm^{-3}$ for the semiconductor layer, $10^{17}$ atoms $cm^{-3}$ for the channel regions and the conductive regions and $10^{16}$ atoms $cm^{-3}$ for the material disposed between the surface of said semiconductor material and the contact.

8. A MESFET structure comprising:
   a semiconductor substrate having a first surface and a second surface and being of a first conductivity type;
   a semiconductor layer of the first conductivity type disposed on said first surface of said substrate;
   a drain contact disposed on said second surface of said substrate;
   conductive regions of a second conductivity type disposed in said semiconductor layer and being separated from each other by a distance and contacted by at least one conductive region contact;
   channel regions of the first conductivity type disposed above said conductive regions and contacted by at lest one Schottky gate contact;
   source regions of the first conductivity type disposed in said channel regions and contacted by at lest one source contact; and
   a shielding region, separate from said at least one gate contact, contacting said semiconductor layer between said conductive regions.

9. A MESFET comprising:
   a gallium arsenide substrate having a first surface and a second surface and being of a first conductivity type;
   a gallium arsenide layer of the first conductivity type disposed on said first surface of said substrate;
   a drain contact disposed on said second surface of said substrate;
   conductive regions of a second conductivity type disposed in said gallium arsenide layer and being separated from each other by a distance;
   gallium arsenide channel regions of the first conductivity type disposed above said conductive regions;
   source regions of the first conductivity type disposed in said channel regions;
   Schottky gate contacts contacting said channel regions; and
   a shielding region, separate from said gate contacts, contacting said gallium arsenide layer between said conductive regions.

10. The transistor of claim 9 wherein the shielding region is disposed in the gallium arsenide layer and is of the second conductivity type.

11. The transistor of claim 9 wherein the shielding region comprises a contact on the surface of the gallium arsenide layer.

12. The transistor of claim 11 wherein the shielding region further comprises a layer of gallium arsenide disposed between the surface of the gallium arsenide layer and the contact.

* * * * *